United States Patent
Aziz et al.

(10) Patent No.: US 6,743,067 B2
(45) Date of Patent: Jun. 1, 2004

(54) ANNEALED ORGANIC LIGHT EMITTING DEVICES AND METHODS OF ANNEALING ORGANIC LIGHT EMITTING DEVICES

(75) Inventors: Hany M. Aziz, Burlington (CA); Zoran D. Popovic, Mississauga (CA); Nan-Xing Hu, Oakville (CA)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 10/347,657

(22) Filed: Jan. 16, 2003

(65) Prior Publication Data

US 2003/0132704 A1 Jul. 17, 2003

Related U.S. Application Data

(62) Division of application No. 09/629,163, filed on Jul. 31, 2000.

(51) Int. Cl.[7] .............................................. H05B 33/10
(52) U.S. Cl. ......................................................... 445/24
(58) Field of Search .............................. 445/24; 313/504

(56) References Cited

U.S. PATENT DOCUMENTS

| | | | |
|---|---|---|---|
| 3,172,862 A | 3/1965 | Gurnee et al. | |
| 4,356,429 A | 10/1982 | Tang | |
| 4,539,507 A | 9/1985 | Van Slyke et al. | |
| 4,717,606 A | * 1/1988 | Hale | 428/1.6 |
| 4,885,211 A | 12/1989 | Tang et al. | |
| 5,141,671 A | 8/1992 | Bryan et al. | |
| 5,150,006 A | 9/1992 | Van Slyke et al. | |
| 5,151,629 A | 9/1992 | Van Slyke | |
| 5,227,252 A | 7/1993 | Murayama et al. | |
| 5,247,190 A | 9/1993 | Friend et al. | |
| 5,276,381 A | 1/1994 | Wakimoto et al. | |
| 5,352,906 A | * 10/1994 | Shinar et al. | 257/40 |
| 5,429,884 A | 7/1995 | Namiki et al. | |
| 5,516,577 A | 5/1996 | Matsuura et al. | |
| 5,593,788 A | 1/1997 | Shi et al. | |
| 5,601,903 A | 2/1997 | Fujii et al. | |
| 5,728,801 A | 3/1998 | Wu et al. | |
| 5,846,666 A | 12/1998 | Hu et al. | |
| 5,874,804 A | * 2/1999 | Rogers | 313/512 |
| 5,935,720 A | 8/1999 | Chen et al. | |
| 5,942,340 A | 8/1999 | Hu et al. | |
| 5,952,115 A | 9/1999 | Hu et al. | |
| 6,057,048 A | 5/2000 | Hu et al. | |
| 6,235,414 B1 | * 5/2001 | Epstein et al. | 428/690 |

OTHER PUBLICATIONS

C.W. Tang et al., "Organic Electroluminescent Diodes," Appl. Phys. Lett. 51 (12), pp. 913–915 (1987).
J.R. Sheats et al., "Organic Electroluminescent Devices." Science 273, pp. 884–888 (1996).
J. Salbeck, "Electroluminescence With Organic Compounds." Ber. Bunsenges. Phys. Chem., 100. pp. 1667–1677 (1996).
Z. Shen et al., "Three–Color, Tunable, Organic Light–Emitting Devices," Science 276, pp 2009–2011 (1997).

(List continued on next page.)

*Primary Examiner*—Kenneth J. Ramsey
(74) *Attorney, Agent, or Firm*—Oliff & Berridge, PLC (57) ABSTRACT

Organic light emitting devices includes a light emission region between a cathode and anode. The light emission region comprises an organic light emitting material. The organic light emitting devices are formed by annealing as-fabricated devices. The annealing improves the performance of the as-fabricated devices, by decreasing their operating voltage and increasing their energy conversion efficiency. Multiple organic light emitting devices can be annealed to make the properties of the devices more uniform relative to each other.

19 Claims, 3 Drawing Sheets

OTHER PUBLICATIONS

Bernius et al., "Developmental Progress of Electroluminescent Polymeric Materials and Devices," SPIE Conference On Organic Light Emitting Materials And Devices III, Denver, Colorado, Jul. 1999, SPIE, vol. 3797, pp. 129–137.

Kido et al. "White Light Emitting Organic Electroluminescent Device Usng I anthanide Complexes." Jpn. J Appl-.Phys., vol. 35, pp. I 394–I 396 (1996).

Baldo et al., "Highly Efficient Organic Phosphorescent Emission From Organic Electrolummnescent Devices," Nature, vol 395, pp 151–154 (1998).

Bernius et al., "The Application of Polyfluorenes and Related Polymers in Light Emitting Diodes." SPIE Conference on Light–Emitting Diodes Research, Manufacturing and Applications III, San Jose, California, Jan. 1999, SPIE, vol. 3621, pp. 93–102.

* cited by examiner

ANNEALED ORGANIC LIGHT EMITTING DEVICES AND METHODS OF ANNEALING ORGANIC LIGHT EMITTING DEVICES

CROSS-REFERENCE TO RELATED APPLICATIONS

This is a divisional of application Ser. No. 09/629,163, filed on Jul. 31, 2000.

BACKGROUND OF THE INVENTION

1. Field of Invention

This invention relates to the field of optoelectronic devices and, more particularly, to organic light emitting devices. This invention further relates to methods of annealing organic light emitting devices.

2. Description of Related Art

Tang and Van Slyke reported efficient electroluminescence from a bilayer organic device in 1987. C. W. Tang and S. A. Van Slyke, "Organic Electroluminescent Diodes," *Appl. Phys. Lett.* 51, pp. 913–915, 1987. Since that time, organic light emitting devices (OLEDs) have attracted great attention because of their potential toward the fabrication of large-area displays. See, J. R. Sheats et al, "Organic Electroluminescent Devices," *Science* 273, pp. 884–888, 1996; J. Salbeck, "Electroluminescence with Organic Compounds," *Ber. Bunsenges. Phys. Chem.* 100, pp. 1667–1677, 1996; and Z. Shen et al., "Three-Color, Tunable, Organic Light-Emitting Devices," *Science* 276, pp. 2009–2011, 1997.

As described in the article by Sheats et al., the basic structure of an organic light emitting device comprises two electrodes and an organic material between the electrodes. Electrons are injected into the organic material from a low work function cathode, and holes are injected into the organic material from a high work function anode. The holes and electrons combine in the organic material to form a luminescent excited state.

SUMMARY OF THE INVENTION

Organic light emitting devices (OLEDs) represent a promising technology for various applications. These devices provide important advantages including versatile emission colors, high energy conversion efficiency and relatively low operating voltages. Organic light emitting devices can typically generate light at a brightness level of 100 cd/m$^2$ at an operating voltage of less than 10 volts.

Although known organic light emitting devices can provide the above-stated advantages, there is still a need to further reduce the operating voltage of the devices, but without compromising their quantum efficiency. The quantum efficiency of an organic light emitting device can be defined as the number of emitted photons per electric charge driven into the device. A decrease in the operating voltage with no corresponding reduction in the quantum efficiency relates directly to an increase in the energy conversion efficiency and a decrease in the power consumption of a device including an organic light emitting device. A higher energy conversion efficiency, in turn, corresponds to lower power losses in the form of generated heat and, consequently, reduced device overheating.

This invention provides organic light emitting devices that can satisfy at least some of the above-described needs, as well as other needs. Exemplary embodiments of the organic light emitting devices according to this invention have reduced operating voltages. In addition, exemplary embodiments of the organic light emitting devices according to this invention have increased energy conversion efficiencies.

The organic light emitting devices according to this invention comprise as-fabricated organic light emitting devices that have been annealed. The annealed organic light emitting devices according to this invention comprise an anode, a cathode and a light emission region between the anode and cathode. The light emission region comprises an organic light emitting material.

Embodiments of the organic light emitting devices according to this invention can also comprise a hole transporting region and/or an electron transporting region adjacent to the light emission region.

The annealed organic light emitting devices according to this invention have improved performance characteristics as compared to prior to being annealed. Particularly, the annealed organic light emitting devices have reduced operating voltages, but they do not have reduced quantum efficiencies. Consequently, the annealed organic light emitting devices have increased energy conversion efficiencies.

Exemplary embodiments of the annealed organic light emitting devices according to this invention can emit light at an increased brightness level at a given driving current.

This invention also provides methods of annealing organic light emitting devices. Exemplary embodiments of the methods comprise heating an organic light emitting device at a temperature, and for a period of time, effective to improve the device performance characteristics of the device.

Exemplary embodiments of the methods of annealing organic light emitting devices according to this invention can decrease the operating voltage, and increase the energy conversion efficiency, of the organic light emitting devices, as compared to these same properties prior to the annealing.

In some exemplary embodiments of the methods of annealing organic light emitting devices according to this invention, the annealing results in the organic light emitting devices having increased brightness at a given driving current.

This invention further provides methods of annealing multiple organic light emitting devices, that may each have different properties, so as to make the properties of the different devices more uniform, i.e., more homogeneous. The as-annealed devices having more homogeneous properties can be used in the same device, or optionally in different devices, to provide more consistent device performance.

BRIEF DESCRIPTION OF THE DRAWINGS

Preferred embodiments of this invention will be described in detail, with reference to the following figures, in which.

DETAILED DESCRIPTION OF PREFERRED EMBODIMENTS

This invention provides organic light emitting devices (OLEDs) having improved performance. This invention also provides methods of annealing organic light emitting devices to improve the performance characteristics of the devices.

Exemplary embodiments of the annealed organic light emitting devices according to this invention have reduced operating voltages and also increased energy conversion efficiencies.

Exemplary embodiments of the light emitting devices according to this invention comprise an anode, a cathode and a light emission region between the anode and cathode. The light emission region can comprise a wide range of different organic light emitting materials The organic light emitting devices according to this invention are formed by annealing as-fabricated organic light emitting devices. As a result of the annealing, the properties and performance characteristics of the devices can be significantly improved as compared to the properties and performance characteristics of the devices prior to annealing.

Other exemplary embodiments of the methods of annealing organic light emitting devices according to this invention can form annealed organic light emitting devices that have properties and performance characteristics that are more uniform as compared to those of each other.

Figure 1:
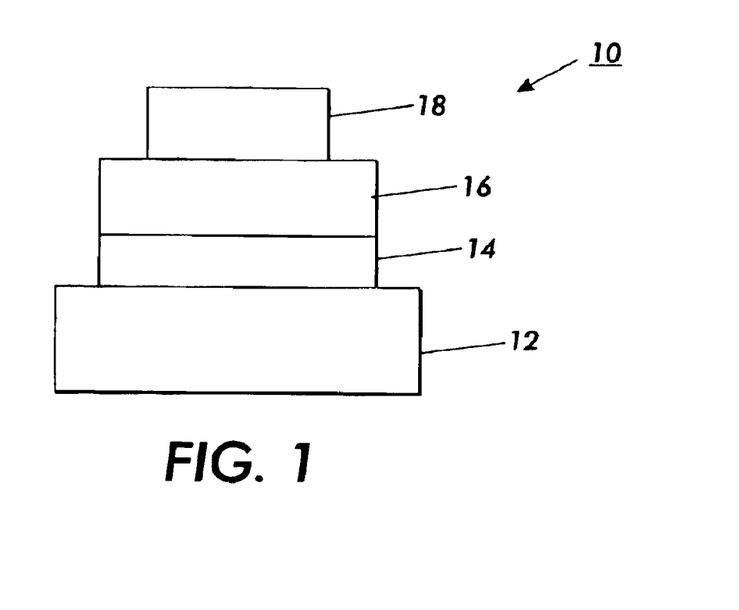
FIG. 1 illustrates an exemplary embodiment of an organic light emitting device according to this invention.

FIG. 1 illustrates an exemplary embodiment of an organic light emitting device (OLED) 10 according to this invention. The organic light emitting device 10 comprises a substrate 12; an anode 14 on the substrate 12; a light emission region 16 on the anode 14; and a cathode 18 on the light emission region 16. During operation, an applied electric field causes positive charges (holes) and negative charges (electrons) to be respectively injected into the light emission region 16 from the anode 14 and the cathode 18 to recombine and thereby produce light emission in the light emission region 16.

The light emission region 16 is comprised of an organic light emitting material. Examples of suitable organic light emitting materials can be selected, for example, from metal oxinoid compounds, stilbene compounds, anthracine compounds, oxadiazole metal chelate compounds, polyfluorenes, polyphenylenevinylenes and derivatives and mixtures thereof. Other suitable organic light emitting materials are described below.

The light emission region 16 can further comprise one or more of hole transport materials and electron transport materials.

In addition, as described below, embodiments of the organic light emitting device 10 can comprise at least one of a hole transport region between the anode 14 and the light emission region 16, and an electron transport region between the cathode 18 and the light emission region 16. Such hole transport regions and/or electron transport regions can be comprised of suitable hole transport materials, such as, for example, polyphenylenevinylenes, polythiophenes, tertiary aromatic amines, and indolocarbazole compounds and other materials; and suitable electron transport materials, such as, for example, metal oxinoids, triazines, oxadiazole metal chelate, stilbenes, polyfluorenes and other materials.

Figure 2:
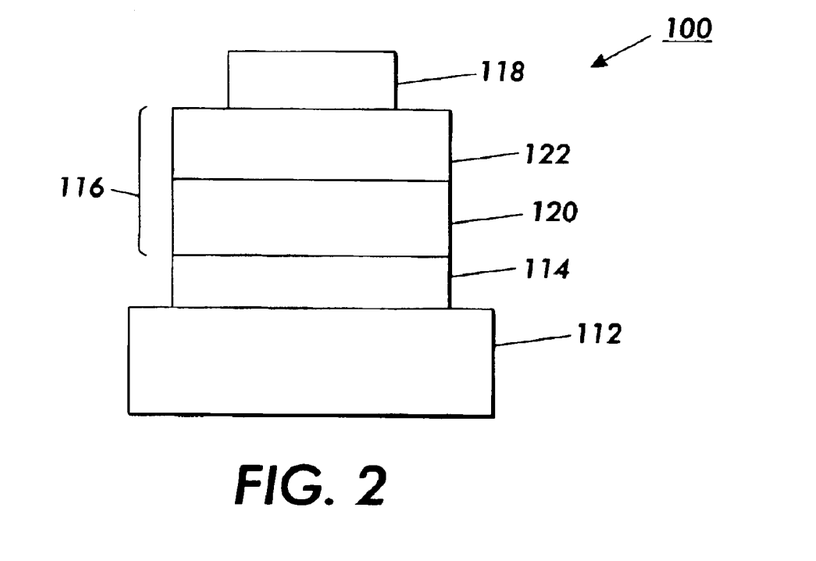
FIG. 2 illustrates another exemplary embodiment of an organic light emitting device according to this invention.

Another exemplary embodiment of an organic light emitting device 100 according to this invention is shown in FIG. 2. The organic light emitting device 100 comprises a substrate 112; an anode 114 on the substrate 112; a light emission region 116 on the anode 114, and a cathode 118 on the light emission region 116. In this embodiment, the organic light emitting device 100 comprises a hole transport region 120 comprised of a hole transport material (HTM) on the anode 114, and an electron transport region 122 comprised of an electron transport material (ETM) on the hole transport region 120 and adjacent to the cathode 118. At least one of the hole transport region 120 and the electron transport region 122 emits light, depending on the compositions of these two regions. Examples of suitable materials for forming the hole transport region 120 and the electron transport region 122 can be selected, for example, from the materials described above.

Figure 3:
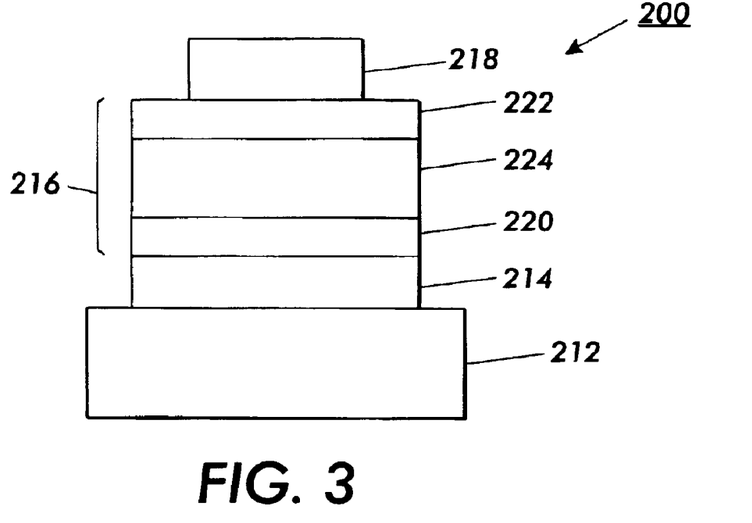
FIG. 3 illustrates still another exemplary embodiment of an organic light emitting device according to this invention.

Another exemplary embodiment of an organic light emitting device 200 according to this invention is illustrated in FIG. 3. The organic light emitting device 200 comprises a substrate 212; an anode 214 on the substrate 212; a light emission region 216 on the anode 214; and a cathode 218 on the light emission region 216.

In the organic light emitting device 200, the light emission region 216 comprises a hole transport region 220, which comprises a hole transport material, on the anode 214; an electron transport region 222, which comprises an electron transport, adjacent to the cathode 218; and a mixed region 224 comprising a mixture of a hole transport material and an electron transport material on the hole transport region 220. Organic light emitting devices comprising such mixed regions are described in co-pending U.S. patent application Ser. No. 09/357,551, filed on Jul. 20, 1999, and U.S. patent application Ser. No. 09/606,670, filed on Jun. 30, 2000, each incorporated herein by reference in its entirety.

In the organic light emitting device 200, the mixed region 224 typically is the light-emitting portion of the light emitting region. Accordingly, in such embodiments, one of the hole transport material and the electron transport material is an emitter. In other embodiments, the mixed region 224 further comprises a light emitting dopant material. In such embodiments, at least one of the hole transport material and the electron transport material comprising the mixed region may also be an emitter.

However, it is contemplated that in other exemplary embodiments of the organic light emitting device 200, light emission can optionally be provided by at least one of the hole transport region 220 and the electron transport region 222. Moreover, in still other exemplary embodiments of the organic light emitting device 200, light emission can be provided by more than one of the hole transport region 220, the mixed region 224 and the electron transport region 222. Examples of suitable materials for forming the hole transport region 220, the electron transport region 222, and the mixed region 224, can be selected from the materials described above. In embodiments in which the mixed region 224 comprises one or more emitting dopant materials, suitable emitting dopant materials can be selected, for example, from fluorescent dyes or phosphorescent materials.

In some exemplary embodiments of the organic light emitting devices 200 according to this invention, only one of the hole transport region 220 or the electron transport region 222 is formed adjacent to the mixed region 224. In embodiments of the organic light emitting devices 200 that comprise the hole transport region 220 between the anode 214 and the mixed region 224, but do not also comprise the electron transport region 222 between the mixed region 224 and the cathode 218, the mixed region 224 contacts the cathode 218. In such embodiments, at least one of the hole transport region 220 and the mixed region 224 is an emitter.

In other embodiments of the organic light emitting devices 200 that comprise the electron transport region 222 between the mixed region 224 and the cathode 218, but do not also comprise the hole transport region 220 between the anode 214 and the mixed region 224, the mixed region 224 contacts the anode 214. In such embodiments, at least one of the electron transport region 222 and the mixed region 224 is an emitter.

In some exemplary embodiments of the organic light emitting-devices according to this invention, at least one of the mixed region 224, the hole transport region 220 and the electron transport region 222 comprises a plurality of separate layers. Such structures are described in incorporated U.S. patent application Ser. Nos. 09/357,551 and 09/606,670. Multiple-layered structures can also be formed for the organic light emitting devices 10 and 100.

According to this invention, the hole transport material of the mixed region 224 and the hole transport material of the hole transport region 220 can be the same material, or they can optionally be different materials. Likewise, the electron transport material of the mixed region 224 and the electron transport material of the electron transport region 222 can be the same material, or they can optionally be different materials.

Other exemplary embodiments of the organic light emitting devices according to this invention comprise a substrate; an anode on the substrate; a light emission region on the anode; and a cathode on the light emission region. In such embodiments, the light emission region comprises a hole transport region comprised of a hole transport material on the anode; a light emitting portion comprised of an organic light emitting material on the hole transport region; and an electron transport region comprised of an electron transport material on the light emitting portion and adjacent to the cathode. Accordingly, the structures of such embodiments of the organic light emitting devices according to this invention are similar to the structure of the organic light emitting device 200 shown in FIG. 3, except that the mixed region 224 is replaced with the light emitting portion. Examples of suitable materials for forming the hole transport region, the light emitting portion and the electron transport region can be selected from those materials described above.

Figure 4:
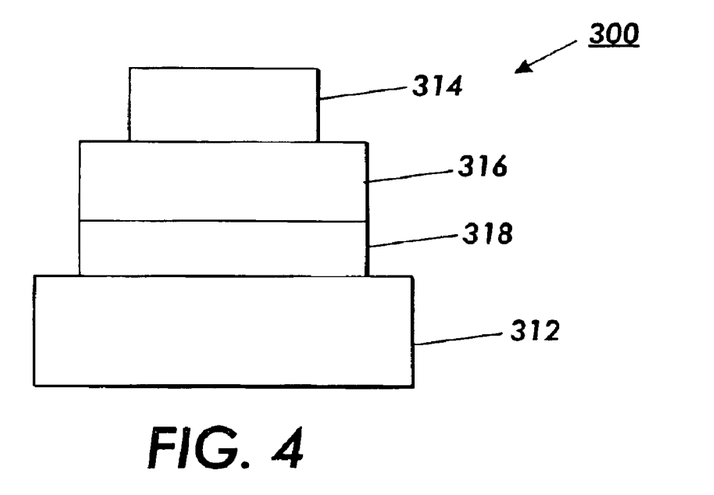
FIG. 4 illustrates another exemplary embodiment of an organic light emitting device according to this invention.

In other exemplary embodiments according to this invention, the organic light emitting devices can comprise a device structure in which the cathode, rather than the anode, contacts the substrate. An exemplary embodiment of such an organic light emitting device 300 is shown in FIG. 4. The organic light emitting device 300 comprises a substrate 312; a cathode 318 on the substrate 312; a light emission region 316 on the cathode 318; and an anode 314 on the light emission region 316. During operation, an applied electric field causes positive charges (holes) and negative charges (electrons) to be respectively injected into the light emission region 316 from the anode 314 and the cathode 318 to recombine and thereby produce light emission in the light emission region 316.

The light emission region 316 can have the same structure as, for example, the light emission region 116 of the organic light emitting device 100, or the light emission region 216 of the organic light emitting device 200.

Embodiments of the organic light emitting devices can be fabricated to emit light over a broad range of wavelengths. By the selection of suitable combinations and mixtures of the emitting materials, hole transport materials and electron transport materials, light emission can be achieved at wavelengths of from about 400 nm to about 700 nm from the organic light emitting devices. Accordingly, the organic light emitting devices of this invention can emit light having a range of different colors by appropriate material selection. This versatility of emission colors enables the organic light emitting devices of this invention to be used in various applications where certain specific light colors, such as red, green or blue are desired.

Various emitting materials, hole transport materials and electron transport materials are known in the art, as also is their combined selection to achieve desired color emissions. Furthermore, the selection of such materials to provide a desired color emission can be readily conducted by one of ordinary skill in the art using routine experimentation.

Embodiments of the organic light emitting devices can be operated under alternating current (AC) and/or direct current (DC) driving conditions. As described in greater detail below, AC driving conditions are preferred in some embodiments to provide extended operational lifetimes.

The different portions of the organic light emitting devices according to this invention will now be described in greater detail.

The substrate 12, 112, 212 and 312 can comprise any suitable material. For example, the substrate 12, 112, 212, 312 can comprise polymeric components, glass, quartz and the like. Suitable polymeric components include, but are not limited to, polyesters such as MYLAR®, polycarbonates, polyacrylates, polymethacrylates, polysulfones and the like. Mixtures of these various materials can also be used. Other substrate materials can also be selected provided, for example, that the materials can effectively support the other layers, and do not interfere with the device functional performance. Preferably, in embodiments, the substrate 12, 112, 212 and 312 is formed of a light transmission material.

The thickness of the substrate 12, 112, 212 and 312 is not particularly limited except by the structural demands of the organic light emitting device and its intended use. The substrate can typically have a thickness, for example, of from about 25 $\mu$m to at least about 1,000 $\mu$m.

The anode 14, 114, 214 and 314 formed on the substrate 12, 112, 212 and the light emitting region 316, respectively, can comprise any suitable known or later developed material. For example, positive charge injecting electrodes such as indium tin oxide (ITO), tin oxide, gold and platinum can be used. Other suitable materials for the anode include, but are not limited to, electrically conductive carbon, $\pi$-conjugated polymers such as polyaniline, polypyrrole and the like having, for example, a work function of at least about 4 eV, and preferably from about 4 eV to about 6 eV.

The anode 14, 114, 214 and 314 can have any suitable structure. A thin conductive layer can be coated onto a light transmissive substrate, such as, for example, a transparent or substantially transparent glass plate or plastic film. Embodiments of the organic light emitting devices according to this invention can comprise a light transmissive anode formed from tin oxide or indium tin oxide (ITO) coated on a glass plate. Also, very thin light-transparent metallic anodes having a thickness, for example, of less than about 200 Å, and, preferably from about 75 Å to about 150 Å can be used. These thin anodes can comprise metals such as gold, palladium and the like. In addition, transparent or semi-transparent thin layers of conductive carbon or the above-mentioned conjugated polymers, having a thickness of, for example from 50 Å to about 175 Å can be used as anodes. Additional suitable forms of the anode 14, 114, 214 and 314 (and the cathode 18, 118, 218 and 318, as described in greater detail below) are disclosed in U.S. Pat. No. 4,885,211, which is incorporated herein by reference in its entirety.

The thickness of the anode 14, 114, 214 and 314 can range from about 1 nm to about 500 nm, with the preferred thickness range depending on the optical constants of the anode material. One preferred range of thickness of the anode is from about 30 nm to about 300 nm. Of course, thicknesses outside of this range can also be used.

The light emitting region 16, 116, 216, 316 can comprise any suitable known or later developed one or more materials comprising an organic light emitting material. Suitable organic light emitting materials that can be utilized in the light emitting region 16, 116, 216, 316 include the polyphenylenevinylenes, such as, for example, poly(p-phenylenevinylene) (PPV), poly(2-methoxy-5-(2-ethylhexyloxy)1,4-phenylenevinylene) (MEHPPV); poly(2,5-dialkoxyphenylenevinylene) (PDMeOPV), and other materials disclosed in U.S. Pat. No. 5,247,190, which is incorporated herein by reference in its entirety.

Other suitable organic light emitting materials that can be utilized in the light emitting region 16, 116, 216, 316 include the polyphenylenes, such as, for example, poly(p-phenylene) (PPP), ladder-poly-para-phenylene (LPPP) and poly(tetrahydropyrene) (PTHP).

Still other suitable exemplary organic light emitting materials that can be utilized in the light emitting region 16, 116, 216, 316 are the polyfluorenes, such as, for example, poly (9,9-di-n-octylfluorene-2,7-diyl), poly(2,8-(6,7,12,12-tetraalkylindenofluorene), and also copolymers containing fluorenes such as fluorene-amine copolymers, as described, for example, in Bernius et al., "Proceedings of SPIE Conference on Organic Light Emitting Materials and Devices III," Denver, Colo., July 1999, Vol. 3797, p. 129, which is incorporated herein by reference in its entirety.

A preferred class of organic light emitting materials that can be utilized in the light emitting region 16, 116, 216, 316 includes, but is not limited to, the metal oxinoid compounds as disclosed in U.S. Pat. Nos. 4,539,507; 5,151,629; 5,150,006; 5,141,671 and 5,846,666, which are each incorporated herein by reference in their entirety. Illustrative examples include tris(8-hydroxyquinolinate) aluminum ($Alq_3$), which is one preferred example, and bis(8-hydroxyquinolato)-(4-phenylphenolato) aluminum (BAlq), which is another preferred example. Other examples of this class of materials include tris(8-hydroxyquinolinate) gallium, bis(8-hydroxyquinolinate) magnesium, bis(8-hydroxyquinolinate) zinc, tris(5-methyl-8-hydroxyquinolinate) aluminum, tris(7-propyl-8-quinolinolato) aluminum, bis[benzo{f}-8-quinolinate]zinc, bis(10-hydroxybenzo[h]quinolinate) beryllium, and the like, and metal thioxinoid compounds disclosed in U.S. Pat. No. 5,846,666, such as metal thioxinoid compounds of bis(8-quinolinethiolato)zinc, bis(8-quinolinethiolato)cadmium, tris(8-quinolinethiolato) gallium, tris(8-quinolinethiolato)indium, bis(5-methylquinolinethiolato)zinc, tris(5-methylquinolinethiolato)gallium, tris(5-methylquinolinethiolato)indium, bis(5-methylquinolinethiolato)cadmium, bis(3-methylquinolinethiolato)cadmium, bis(5-methylquinolinethiolato)zinc, bis[benzo{f}-8-quinolinethiolato]zinc, bis[3-methylbenzo{f}-8-quinolinethiolato]zinc, bis[3,7-dimethylbenzo{f }-8-quinolinethiolato]zinc, and the like. Preferred materials are bis(8-quinolinethiolato)zinc, bis(8-quinolinethiolato) cadmium, tris(8-quinolinethiolato)gallium, tris(8-quinolinethiolato)indium and bis[benzo[{f}-8-quinolinethiolato]zinc.

Another preferred class of organic light emitting materials which can be used in the light emitting region 16, 116, 216, 316 comprises stilbene derivatives, such as those disclosed in U.S. Pat. No. 5,516,577, incorporated herein by reference in it entirety. A preferred stilbene derivative is 4,4'-bis(2,2-diphenylvinyl)biphenyl.

Another class of suitable organic light emitting materials for forming the light emitting region 16, 116, 216, 316 are the oxadiazole metal chelates disclosed in co-pending U.S. patent application Ser. No. 08/829,398, filed Mar. 31, 1997, and incorporated herein by reference in its entirety. These materials include bis[2-(2-hydroxyphenyl)-5-phenyl-1,3,4-oxadiazolato]zinc; bis[2-(2-hydroxyphenyl)-5-phenyl-1,3,4-oxadiazolato]beryllium; bis[2-(2-hydroxyphenyl)-5-(1-naphthyl)-1,3,4-oxadiazolato]zinc; bis[2-(2-hydroxyphenyl)-5-(1-naphthyl)-1,3,4-oxadiazolato] beryllium; bis[5-biphenyl-2-(2-hydroxyphenyl)-1,3,4-oxadiazolato]zinc; bis[5-biphenyl-2-(2-hydroxyphenyl)-1,3,4-oxadiazolato]beryllium; bis(2-hydroxyphenyl)-5-phenyl-1,3,4-oxadiazolato]lithium; bis[2-(2-hydroxyphenyl)-5-p-tolyl-1,3,4-oxadiazolato]zinc; bis[2-(2-hydroxyphenyl)-5-p-tolyl-1,3,4-oxadiazolato]beryllium; bis[5-(p-tert-butylphenyl)-2-(2-hydroxyphenyl)-1,3,4-oxadiazolato]zinc; bis[5-(p-tert-butylphenyl)-2-(2-hydroxyphenyl)-1,3,4-oxadiazolato]beryllium; bis[2-(2-hydroxyphenyl)-5-(3-fluorophenyl)-1,3,4-oxadiazolato]zinc; bis[2-(2-hydroxyphenyl)-5-(4-fluorophenyl)-1,3,4-oxadiazolato] zinc; bis[2-(2-hydroxyphenyl)-5-(4-fluorophenyl)-1,3,4-oxadiazolato]beryllium; bis[5-(4-chlorophenyl)-2-(2-hydroxyphenyl)-1,3,4-oxadiazolato]zinc; bis[2-(2-hydroxyphenyl)-5-(4-methoxyphenyl)-1,3,4-oxadiazolato] zinc; bis[2-(2-hydroxy-4-methylphenyl)-5-phenyl-1,3,4-oxadiazolato]zinc; bis[2-α-(2-hydroxynaphthyl)-5-phenyl-1,3,4-oxadiazolato]zinc; bis[2-(2-hydroxyphenyl)-5-p-pyridyl-1,3,4-oxadiazolato]zinc; bis[2-(2-hydroxyphenyl)-5-p-pyridyl-1,3,4-oxadiazolato]beryllium; bis[2-(2-hydroxyphenyl)-5-(2-thiophenyl)-1,3,4-oxadiazolato]zinc; bis[2-(2-hydroxyphenyl)-5-phenyl-1,3,4-thiadiazolato]zinc; bis[2-(2-hydroxyphenyl)-5-phenyl-1,3,4-thiadiazolato] beryllium; bis[2-(2-hydroxyphenyl)-5-(1-naphthyl)-1,3,4-thiadiazolato]zinc; bis[2-(2-hydroxyphenyl)-5-(1-naphthyl)-1,3,4-thiadiazolato]beryllium, and the like.

Another class of suitable organic light emitting materials that can be utilized in the light emitting region 16, 116, 216, 316 are the triazines, as disclosed in U.S. Pat. No. 6,057,048 and co-pending U.S. patent application Ser. No. 09/489,144, filed Jan. 21, 2000, which are each incorporated herein by reference in their entirety.

Another class of suitable organic light emitting materials that can be utilized in the light emitting region 16, 116, 216, 316 are the anthracines.

Other preferred examples of organic light emitting materials that can be utilized in the light emitting region 16, 116, 216, 316 are fluorescent materials, such as, for example, coumarin, dicyanomethylene pyranes, polymethine, oxabenzanthrane, xanthene, pyrylium, carbostyl, perylene, and the like. Another specially preferred class of fluorescent materials are the quinacridone dyes. Illustrative examples of quinacridone dyes include quinacridone, 2-methylquinacridone, 2,9-dimethylquinacridone; 2-chloroquinacridone; 2-fluoroquinacridone; 1,2-benzoquinacridone; N,N'-dimethylquinacridone; N,N'-dimethyl-2-methylquinacridone; N,N'-dimethyl-2,9-dimethylquinacridone; N,N'-dimethyl-2-chloroquinacridone; N,N'-dimethyl-2-fluoroquinacridone; N,N'-dimethyl-1,2-benzoquinacridone, and the like, as disclosed in U.S. Pat. Nos. 5,227,252; 5,276,381 and 5,593,788, which are each incorporated herein in their entirety. Another preferred class of fluorescent materials are fused ring fluorescent dyes. Examples of the fused ring fluorescent dyes include perylene, rubrene, anthracene, coronene, phenanthrecene, pyrene, and the like, as illustrated in U.S. Pat. No. 3,172,862, which is incorporated herein by reference in its entirety. Also, fluorescent materials include butadienes, such as 1,4-diphenylbutadiene and tetraphenylbutadiene, stilbenes, and the like, as disclosed in U.S. Pat. Nos. 4,356,429 and 5,516,577, which are each incorporated herein by reference in their entirety. Other examplary fluorescent materials that can be used are disclosed in U.S. Pat. No. 5,601,903, which is incorporated herein by reference in its entirety.

Another preferred class of organic light emitting materials that can be utilized in the light emitting region 16, 116, 216, 316 are fluorescent dyes, as disclosed in U.S. Pat. No. 5,935,720, which is incorporated herein by reference in its entirety. Exemplary materials include, for example, 4-(dicyanomethylene)-2-1-propyl-6-(1,1,7,7-tetramethyljulolidyl-9-enyl)-4H-pyran (DCJTB).

Another preferred class of organic light emitting materials that can be utilized in the light emitting region 16, 116, 216, 316 are the lanthanide metal chelate complexes, such as, for example, tris(acety lacetonato)(phenanthroline) terbium, tris (acetyl acetonato)(phenanthroline) europium, and tris (thenoyl trisfluoroacetonato)(phenanthroline) europium, as disclosed in Kido et al., "White Light Emitting Organic Electroluminescent Device Using Lanthanide Complexes," Jpn.J.Appl.Phys., Vol. 35, pp. L394-L396 (1996), which is incorporated herein by reference in its entirety.

Another preferred class of organic light emitting materials that can be utilized in the light emitting region 16, 116, 216, 316 are the phosphorescent materials, such as, for example, organometallic compounds containing heavy metal atoms that lead to strong spin-orbit coupling, such as those compounds disclosed in Baldo et. al., "Highly Efficient Organic Phosphorescent Emission from Organic Electroluminescent Devices," Letters to Nature, Vol. 395, pp 151–154 (1998). Preferred examples include 2,3,7,8,12,13,17,18-octaethyl-21H23H-phorpine platinum(II) (PtOEP) and fac tris(2-phenylpyridine)iridium (Ir(ppy)$_3$).

The hole transport material that can be utilized in forming the light emission region 16, 316, the hole transport region 120, 220, and the mixed region 224, and the electron transport material that can be utilized in forming light emission region 16, 316, the electron transport region 122, 222 and the mixed region 224, can be any suitable known or later developed material.

Exemplary hole-transporting materials that can be utilized in the light emission region 16, 316, the hole transport region 120, 220, and the mixed region 224 include polypyrrole, polyaniline, poly(phenylene vinylene), polythiophene, polyarylamine (which are disclosed in U.S. Pat. No. 5,728,801, incorporated herein by reference in its entirety) and their derivatives, and known semiconductive organic materials; porphyrin derivatives such as 1,10,15,20-tetraphenyl-21H, 23H-porphyrin copper (II) disclosed in U.S. Pat. No. 4,356, 429, incorporated herein by reference in its entirety; copper phthalocyanine, copper tetramethyl phthalocyanine, zinc phthalocyanine, titanium oxide phthalocyanine, magnesium phthalocyanine and the like A preferred class of hole transporting materials that can be utilized in the light emission region 16, 316, the hole transport region 120, 220, and the mixed region 224 are the aromatic tertiary amines such as those disclosed in U.S. Pat. No. 4,539,507, which is incorporated herein by reference in its entirety. Suitable exemplary aromatic tertiary amines include, for example, bis(4-dimethylamino-2-methylphenyl) phenylmethane; N,N,N-tri(p-tolyl)amine; 1,1-bis(4-di-p-tolylaminophenyl)cyclohexane; 1,1-bis(4-di-p-tolylaminophenyl)-4-phenyl cyclohexane; N,N'-diphenyl-N, N'-bis(3-methylphenyl)-1,1-biphenyl-4,4'-diamine; N,N'-diphenyl-N,N'-bis(3-methylphenyl)-1,1'-biphenyl-4,4'-diamine; N,N'-diphenyl-N,N'-bis(4-methoxyphenyl)-1,1'-biphenyl-4,4'-diamine, N,N,N',N'-tetra-p-tolyl-1,1'-biphenyl-4,4'-diamine; N,N'-di-1-naphthyl-N,N'-diphenyl-1,1'-biphenyl-4,4'-diamine; mixtures thereof and the like.

Another class of aromatic tertiary amines that can be utilized in the light emission region 16, 316, the hole transport region 120, 220, and the mixed region 224 is the polynuclear aromatic amines. Examples of such polynuclear aromatic amines include, for example, N,N-bis-[4'-(N-phenyl-N-m-tolylamino)-4-biphenylyl]aniline; N,N-bis-[4'-(N-phenyl-N-m-tolylamino)-4-biphenylyl]-m-toluidine; N,N-bis-[4'-(N-phenyl-N-m-tolylamino)-4-biphenylyl]-p-toluidine; N,N-bis-[4'-(N-phenyl-N-p-tolylamino)-4-biphenylyl]aniline; N,N-bis-[4'-(N-phenyl-N-p-tolylamino)-4-biphenylyl]-m-toluidine; N,N-bis-[4'-(N-phenyl-N-p-tolylamino)-4-biphenylyl]-p-toluidine; N,N-bis-[4'-(N-phenyl-N-p-chlorophenylamino)-4-biphenylyl]-m-toluidine; N,N-bis-[4'-(N-phenyl-N-m-chlorophenylamino)-4-biphenylyl]-m-toluidine; N,N-bis-[4'-(N-phenyl-N-m-chlorophenylamino)-4-biphenylyl]-p-toluidine; N,N-bis-[4'-(N-phenyl-N-m-tolylamino)-4-biphenylyl]-p-chloroaniline; N,N-bis-[4'-(N-phenyl-N-p-tolylamino)-4-biphenylyl]-m-chloroaniline; N,N-bis-[4'-(N-phenyl-N-m-tolylamino)-4-biphenylyl]-1-aminonaphthalene, mixtures thereof and the like.

Another class of hole transporting materials that can be utilized in the light emission region 16, 316, the hole transport region 120, 220, and the mixed region 224 is comprised of 4,4'-bis(9-carbazolyl)-1,1'-biphenyl compounds, such as, for example, 4,4'-bis(9-carbazolyl)-1, 1'-biphenyl; 4,4'-bis(3-methyl-9-carbazolyl)-1,1'-biphenyl, and the like.

A preferred class of the hole transporting materials materials that can be utilized in the light emission region 16, 316, the hole transport region 120, 220, and the mixed region 224 is the indolo-carabazoles, such as those disclosed in U.S. Pat. Nos. 5,942,340 and 5,952,115, which are incorporated herein by reference in their entirety.

Another preferred class of hole transporting materials that can be utilized in the light emission region 16, 316, the hole transport region 120, 220, and the mixed region 224 is comprised of N,N,N'N'-tetraarylbenzidines, wherein aryl may be selected from phenyl, m-tolyl, p-tolyl, m-methoxyphenyl, p-methoxyphenyl, 1-naphthyl, 2-naphthyl and the like. Illustrative examples of N,N,N'N'-tetraarylbenzidine are N,N'-di-1-naphthyl-N,N'-diphenyl-1, 1'-biphenyl-4,4'-diamine, which is more preferred; N,N'-bis (3-methylphenyl)-N,N'-diphenyl-1,1'-biphenyl-4,4'-diamine; N,N'-bis(3-methoxyphenyl)-N,N'-diphenyl-1,1'-biphenyl-4,4'-diamine, and the like.

Preferred hole transporting materials that can be utilized in the light emission region 16, 316, the hole transport region 120, 220, and the mixed region 224 are the naphtyl-substituted benzidine derivatives.

Examples of electron transport material that can be utilized in forming the light emission region 16, 316 the electron transport region 122, 222 and the mixed region 224, can be selected from metal oxinoid compounds, the oxadiazole metal chelate compounds, the triazine compounds and the stilbene compounds, examples of which are described above.

Other examples of electron transport material that can be utilized in forming light emission region 16, 316, the electron transport region 122, 222, and the mixed region 224 are the polyfluorenes, such as poly(9,9-di-n-octylfluorene-2,7-diyl), poly(2,8-(6,7,12,12-tetraalkylindenofluorene) and copolymers containing fluorenes such as fluorene-amine copolymers. See, for example, Bernius et al., "Proceedings of SPIE Conference on Organic Light Emitting Materials and Devices III," Denver, Colo., July 1999, Vol. 3797, p. 129.

According to this invention, the mixed region 224 can comprise from about 10 wt. % to about 90 wt. % of the hole transport material, and from about 90 wt. % to about 10 wt. % of the electron transport material. Preferably, the mixed region 224 comprises from about 25 wt. % to about 75 wt. % of the hole transport material, and from about 75 wt. % to about 25 wt. % of the electron transport material. Another preferred range is from about 40 wt. % to about 60 wt. % of the hole transport material and from about 60 wt. % to about 40 wt. % of the electron transport material.

According to this invention, in embodiments, the mixed region can comprise at least one emitting dopant material. In such embodiments, the mixed region 224 can comprise from about 10 wt. % to about 90 wt. % of the hole transport material; from about 90 wt. % to about 10 wt. % of the electron transport material; and from about 0.1 wt. % to about 25 wt. % of the emitting dopant material. Preferably, the mixed region 224 comprises from about 25 wt. % to about 75 wt. % of the hole transport material; from about 75 wt. % to about 25 wt. % of the electron transport material, and from about 0.1 wt. % to about 5 wt. % of the emitting dopant material.

The mixed region can be formed using mixtures of any of the suitable exemplary hole transport materials and electron transport materials described above.

The one or more layers comprising the light emission region 16, 116, 216, 316 can be prepared by forming one of the above-described materials into thin films by any suitable known or later developed method. Suitable methods for this purpose include, for example, vapor deposition and spin-coating techniques.

The light emission region 16, 116, 216, 316 can have a thickness ranging from about 10 nm to about 1000 nm. Preferably, this thickness is from about 50 nm to about 250 nm. In embodiments in which the light emission region is comprised of one or more adjacent layers, the thickness of the individual layers is at least about 5 nm.

The cathode 18, 118, 218, 318 can comprise any suitable metal, including high work function components, having a work function, for example, from about 4.0 eV to about 6.0 eV, or low work function components, such as metals with, for example, a work function of from about 2.5 eV to about 4.0 eV. The cathode can comprise a combination of a low work function (less than about 4 eV) metal and at least one other metal. Effective proportions of the low work function metal to the second or other metal are from less than about 0.1 wt. % to about 99.9 wt. %. Illustrative examples of low work function metals include, but are not limited to, alkaline metals such as lithium or sodium; Group 2A or alkaline earth metals such as beryllium, magnesium, calcium or barium; and Group III metals including rare earth metals and the actinide group metals such as scandium, yttrium, lanthanum, cerium, europium, terbium or actinium. Lithium, magnesium and calcium are preferred low work function metals.

The Mg—Ag alloy cathodes of U.S. Pat. No. 4,885,211 are one preferred cathode construction. Another preferred cathode construction is described in U.S. Pat. No. 5,429,884, wherein the cathodes are formed from lithium alloys with other high work function metals such as aluminum and indium. These patents are incorporated herein by reference in their entirety.

The thickness of the cathode 18, 118, 218, 318 can range from, for example, about 10 nm to about 500 nm. Of course, thicknesses outside of this range can also be used.

Exemplary embodiments of the methods of treating organic light emitting devices according to this invention comprise annealing any one of the exemplary organic light emitting devices 10, 100, 200 or 300, as well as any other organic light emitting devices formed in accordance with this invention, to improve the performance characteristics of the annealed devices as compared to the performance characteristics of the same devices prior to being annealed.

Exemplary embodiments of the methods of treating organic light emitting devices according to this invention comprise providing an as-fabricated organic light emitting device, which can be, for example, any of the exemplary organic light emitting devices 10, 100, 200 or 300. The organic light emitting device comprises an anode, a cathode and a light emission region between the anode and cathode. The light emission region can comprise any one of the structures of the light emission regions 16, 116, 216, 316 as described above, or any other structure formed in accordance with this invention. The organic light emitting device is annealed at an annealing temperature, and for an amount of time (annealing period), effective to improve the device performance characteristics.

Typically, the organic light emitting device is annealed to decrease its operating voltage, and to increase its energy conversion efficiency, as compared to prior to the annealing. In exemplary embodiments of the methods of annealing organic light emitting devices according to this invention, the annealing of the as-fabricated organic light emitting device decreases the operating voltage of the as-fabricated organic light emitting device by at least about 10%. Preferably, the annealing decreases the operating voltage of the as-fabricated devices by at least about 20% and, more preferably, by at least about 30%.

By reducing the operating voltage, the power consumption of the organic light emitting devices according to this invention is also reduced. The power consumption of the annealed organic light emitting device is at least about 10% lower than that of non-annealed devices. Preferably, the annealing decreases the power consumption of of the as-fabricated devices by at least about 20% and, more preferably, by at least about 30%.

The energy conversion efficiency of an organic light emitting device can be defined as the ratio of the light output to the power input to the device. In exemplary embodiments of the methods of annealing organic light emitting devices according to this invention, the annealing of the as-fabricated organic light emitting device increases the energy conversion efficiency of the as-fabricated organic light emitting device by at least about 10%. Preferably, the annealing increases the energy conversion efficiency of the as-fabricated device by at least about 25% and, more preferably, by at least about 40%.

In embodiments of the methods of treating organic light emitting devices according to this invention, the annealing of the as-fabricated organic light emitting device is conducted at an annealing temperature that is below the melting temperature of the material forming the light emission region. Preferably, the annealing temperature is below the glass transition temperature of at least one of the materials forming the light emission region. More preferably, the annealing temperature is below the glass transition temperature of the material having the lowest glass transition temperature of all the materials forming the organic light emitting device. Typically, the annealing temperature is from about 50° C. to about 150° C., depending on the composition of the light emission region. Preferably, the annealing temperature is from about 60° C. to about 100° C.

The annealing temperature is preferably also selected to avoid any substantial structural changes of the organic light emitting devices as a result of the annealing. For example, substantial structural changes include the interdiffusion of substances between the different layers of the organic light emitting devices, such as, for example, between the mixed region and regions adjacent to the mixed region. Also, the annealing temperature is selected so that it does not actually cause the operating voltage of the annealed device to be higher than that of the device prior to annealing.

The annealing time of the organic light emitting devices is selected to be sufficient to achieve the desired improvement in the performance characteristics of the organic light emitting devices. Generally, as the annealing temperature is increased, the annealing time is decreased to achieve the desired results. In embodiments, the annealing time can be from about 0.1 hrs. to about 100 hrs. Preferably, the annealing time is from about 0.25 hrs. to about 25 hrs.

This invention also provides exemplary embodiments of methods of treating a plurality of organic light emitting devices to increase the homogeneity of the performance characteristics of the different organic light emitting devices relative to each other. For example, two or more organic light emitting devices can be subjected to an annealing treatment at a temperature, and for an amount of time, effective to make the performance characteristics of the different organic light emitting devices closer to each other, i.e., to make the performance characteristics more uniform, or homogeneous, relative to each other.

In some embodiments, the different organic light emitting devices are annealed simultaneously in the same annealing chamber. However, in other exemplary embodiments, the different organic light emitting devices can be annealed at different times in the same annealing chamber, or can be annealed in different annealing chambers. In such former and latter embodiments, the annealing conditions used for the different organic light emitting devices are typically approximately equal in the same annealing chamber, or in different annealing chambers, to promote more uniform results.

The organic light emitting devices are annealed under any suitable annealing atmosphere. For example, the annealing atmosphere can comprise any suitable gas such as, for example, nitrogen, argon, helium, carbon dioxide, or mixtures thereof, or any other suitable gases that do not have a negative effect on the performance of the device. Other suitable annealing environments can be atmospheres deficient in moisture, such as for example, dry air. Another example of annealing environments are vacuum environments, with pressures below from about $10^{-2}$ to about $10^{-10}$ mm of Hg, and preferably below from about $10^{-3}$ to about $10^{-6}$ mm of Hg.

For example, two or more organic light emitting devices can be annealed to affect the operating voltage of each of the as-fabricated organic light emitting devices, and also to affect the energy conversion efficiency of each of the as-fabricated organic light emitting devices, such that the operating voltages and/or energy conversion efficiencies of the different organic light emitting devices differ by less than some approximate percentage. For example, in embodiments, the operating voltages and/or energy conversion efficiencies of the different organic light emitting devices can typically differ by less than about 15%. Preferably, the operating voltages and/or energy conversion efficiencies of the different organic light emitting devices can typically differ by less than about 10%.

The rate of heating (i.e., the speed by which the organic light emitting device temperature increases up to the desired annealing temperature range) and rate of cooling (i.e., the speed of cooling the organic light emitting device from the annealing temperature to a lower desired temperature, such as ambient temperature, following the completion of the annealing time) are preferably sufficiently low to not cause damage, such as, for example, cracking or shorting in the devices. Suitable heating and cooling rates for the organic light emitting devices can be, for example, from about 0.5° C./min to about 20° C./min, and preferably from about 1° C./min to about 5° C./min.

EXAMPLES

The following examples are provided to further illustrate various aspects of this invention, and are not intended to limit the scope of the invention.

Example 1

Example 1 demonstrates the effect of annealing on reducing the organic light emitting device operating voltage and, thus, increasing the energy conversion efficiency. A structure as shown in FIG. 3 is used. The mixed region 224 further comprises a dye dopant. Organic light emitting devices comprising a mixed region containing a dopant material are described in incorporated U.S. patent application Ser. No. 09/606,670. A naphthyl-substituted benzidine (NPB), a tris (8-hydroxyquinoline) aluminium ($ALQ_3$) and dimethyl-quinacridone (DMQ) are used as the hole transport material of the bole transport region 220 and the mixed region 224, the electron transport material of the electron transport region 222 and the mixed region 224, and the dye dopant of the mixed region 224, respectively. The anode 214 is formed of indium tin oxide and the cathode 218 is formed of Mg:Ag.

Figure 5:
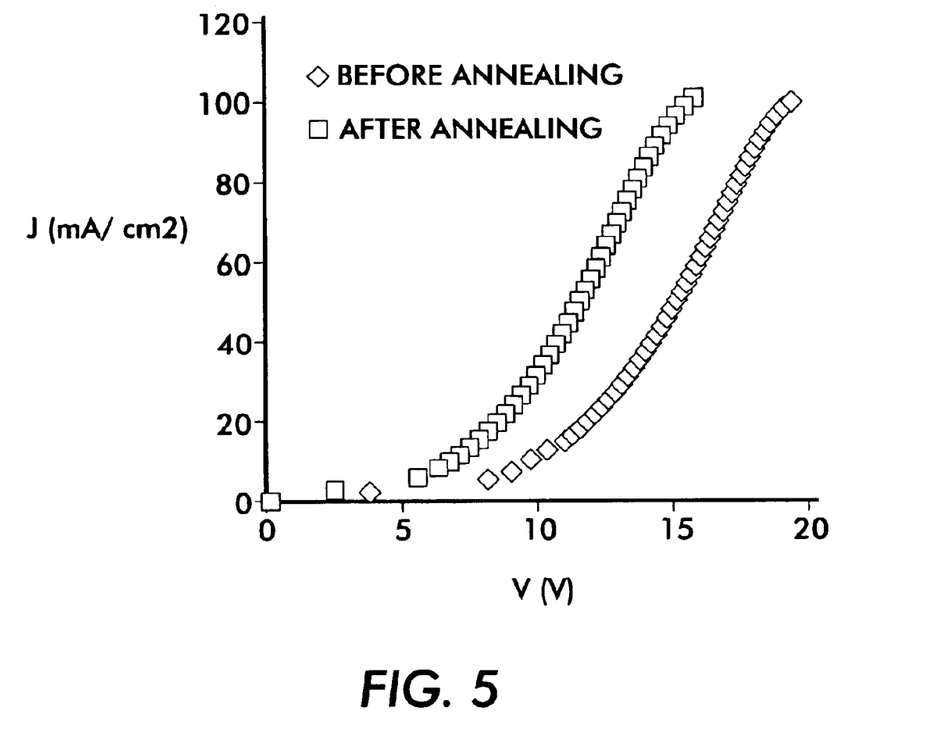
FIG. 5 shows the current density versus voltage characteristics of an organic light emitting device, as measured before and after annealing the device.

FIG. 5 shows the current density versus voltage characteristics of the organic light emitting device, as measured both before and after annealing. The annealing included heating the device at a temperature of about 90° C. for an annealing period of about 20 hours. The shift of the current density versus voltage characteristics to lower voltages in the as-annealed device demonstrates the reduction in the operating voltage required to drive a certain current density (and hence to obtain a certain luminance).

As shown in FIG. 5, if the annealed organic light emitting device is operated at a current density of about 4 mA/cm² (to obtain a luminance of about 250 cd/m², which is typical for displays), the decrease in voltage that results from the annealing is about 40%. This decrease in voltage results further in an increase in the energy conversion efficiency by about 60% if the device is operated at this luminance.

Example 2

Example 2 demonstrates the effect of annealing an as-fabricated organic light emitting device with respect to reducing its operating voltage and, thus, also increasing its energy conversion efficiency. In Example 2, the organic light emitting device has the same general structure as used in Example 1; however, Nile-Red dye is used instead of DMQ as the dye dopant in the mixed region 224. The annealing conditions are the same as used in Example 1. A very similar change in the organic light emitting device characteristics is produced in Example 2, as compared to Example 1.

Example 3

Example 3 demonstrates the effect of annealing on both reducing the organic light emitting device's operating voltage and increasing the electroluminescence quantum efficiency, and, thus, also increasing the energy conversion efficiency. The organic light emitting device structure in Example 3 is the same as in Example 1, except that in Example 3, the hole transport material of the hole transport region 220 only is comprised of indolocarbazole-compound instead of the NPB used in Example 1.

After annealing at 100° C. for 24 hours, the driving voltage needed to drive a current of density of about 5 mA/cm$^2$ (to achieve a luminance of about 250 cd/m$^2$) decreases by about 9%. In the same time, the luminance at this current density increases by about 10% (i.e., the quantum efficiency increases by about 10%). The changes in both the driving voltage and the electroluminescence efficiency result in an increase in the over-all energy conversion efficiency of the device by about 20% at this level of luminance.

Example 4

Example 4 demonstrates the effect of annealing on reducing the organic light emitting device operating voltage and, thus, increasing the energy conversion efficiency. An organic light emitting device having a structure as shown in FIG. 2 is tested. In this device, an indolocarbazole-compound and tris (8-hydroxyquinoline) aluminium (ALQ$_3$) are used as the hole transport material in the hole transport region 120 and the emitting electron transport material in the electron transport region 122, respectively. The anode 112 is formed of indium tin oxide and the cathode 118 is comprised of Mg:Ag.

The device is annealed at a temperature of about 100° C. for about 24 hours. As a result of annealing, the driving voltage needed to drive a current density of about 5 mA/cm$^2$ (to achieve a luminance of about 250 cd/m$^2$) decreases by about 15%. This decrease in the operating voltage corresponds to an increase in the energy conversion efficiency of the organic light emitting device by about 17% at this luminance level.

Example 5

Example 5 demonstrates the importance of controlling the annealing conditions in order to further improve device performance. An organic light emitting device having the same structure as used in Example 1 is tested. The organic light emitting device is annealed at a temperature of about 100° C. for about 140 hours. As a result of annealing, the driving voltage required to drive a current density of about 4 mA/cm$^2$ (to achieve a luminance of about 250 cd/m$^2$) increases by about 20%. This increase corresponds to a decrease in the energy conversion efficiency of the organic light emitting device of about 17%.

Based on this result, it is apparent that if the temperature and/or the annealing time are not properly selected, the annealing process of the as-fabricated organic light emitting device can adversely affect the device performance.

Example 6

Example 6 demonstrates the use of thermal annealing in order to "homogenize" the device performance of multiple different organic light emitting devices. Three different devices A, B and C, each having a structure as described above in Example 1, are tested. Each of the three devices is fabricated in a separate vacuum run, using the same fabrication process parameters. Evaluation of the devices in the as-fabricated condition shows variations with respect to the characteristics of the three devices. Particularly, the energy conversion efficiencies are about 3, 3.4, and 3.6 lumens/watt for devices A, B and C, respectively. The scatter in the characteristics of the devices is about ±9% from a mean value of 3.33 lumens/watt. This level of scatter is common for organic light emitting devices, and results from slight non-avoidable differences in the fabrication process conditions (e.g., vacuum level, contaminants level, deposition rates, etc.). After annealing the devices together at a temperature of about 100° C. for about 24 hours, the mean energy conversion efficiency increases to about 4.9 lumens/watt, and the scatter from the mean value decreases to about ±3%. Thus, Example 6 shows that the performance characteristics of different organic light emitting devices can be made more uniform by annealing the devices by the methods according to this invention.

The above-described improved performance characteristics of the annealed organic light emitting devices according to this invention can improve the performance of various devices in which the annealed organic light emitting devices are used. Thus, the annealed organic light emitting devices according to this invention can be used in various applications that would benefit from their improved performance characteristics.

For example, the increased energy conversion efficiencies of the annealed organic light emitting devices can decrease the power consumption of displays including one or more of the annealed organic light emitting devices. In addition, the higher energy conversion efficiencies of the annealed organic light emitting devices also correlate to lower power losses in the form of heat and, thus, reduced device overheating in devices including the annealed organic light emitting devices. The annealed organic light emitting devices of this invention can also provide increased brightness at a given driving current. For example, the organic light emitting devices according to the invention can be used in various displays to enhance the displays performance.

In addition, homogenising the performance characteristics of multiple, different organic light emitting devices according to embodiments of the methods of this invention provides important advantages. Namely, multiple organic light emitting devices can be produced that have properties that are more consistent with respect to each other as a result of the annealing. For example, the multiple devices can have consistent energy conversion efficiencies, to allow the devices to be used in applications where device performance uniformity is important. The organic light emitting devices having more uniform performance can be used in devices, such as displays, to provide more consistent performance throughout the display. Furthermore, the organic light emitting devices of this invention can be used in different devices, such as displays, to achieve more consistent performance between the different displays.

The organic light emitting devices according to this invention can be used in various technological applications. For example, the devices can be used in various different types of devices that utilize light-emitting devices, such as the above-described displays. The displays can be, for example, in vehicles, such as automobiles, and in computer monitors, televisions and other such electronic devices and systems.

While the invention has been described in conjunction with the specific embodiments described above, it is evident that many alternatives, modifications and variations are apparent to those skilled in the art. Accordingly, the preferred embodiments of the invention as set forth above are intended to be illustrative and not limiting. Various changes can be made without departing from the spirit and scope of the invention.

What is claimed is:

1. A method of treating an organic light emitting device, comprising:
   providing an as-fabricated organic light emitting device, comprising:
   an anode;
   a cathode; and
   a light emission region that emits light between the anode and cathode, the light emission region including an organic light emitting material; and
   annealing the as-fabricated organic light emitting device at an annealing temperature from about 50° C. and below 100° C. and for an annealing period effective to (i) decrease an operating voltage of the as-fabricated organic light emitting device, and (ii) increase an energy conversion efficiency of the as-fabricated organic light emitting device;
   wherein the annealing temperature is below a glass transition temperature of a material of the organic light emitting device.

2. The method of claim 1, wherein the annealing of the as-fabricated organic light emitting device (i) decreases the operating voltage of the as-fabricated organic light emitting device by at least about 10%, and (ii) increases the energy conversion efficiency of the as-fabricated organic light emitting device by at least about 10%.

3. The method of claim 1, wherein the annealing temperature is below a melting temperature of a material having a lowest melting temperature of the entire organic light emitting device.

4. The method of claim 1, wherein the annealing temperature is below a glass transition temperature of a material having a lowest glass transition temperature of the entire organic light emitting device.

5. The method of claim 1, wherein the annealing period is from about 0.1 hrs. to about 100 hrs.

6. The method of claim 1, wherein the light emission region comprises a mixture of a hole transport material and an electron transport material.

7. The method of claim 1, wherein the light emission region comprises:
   a mixed region including a mixture of a hole transport material and an electron transport material; and
   at least one of (i) a hole transport region between the anode and the mixed region, and (ii) an electron transport region between the cathode and the mixed region;
   wherein at least one of the hole transport region, the electron transport region and the mixed region emits light.

8. The method of claim 7, wherein the hole transport material comprises a tertiary aromatic amine or an indolocarbazole compound, and the electron transport material comprises a metal oxinoid compound, a triazine compound, or a stilbene derivative.

9. The method of claim 1, wherein the organic light emitting device emits light having a wavelength in a range of from about 400 nm to about 700 nm.

10. The method of claim 1, wherein the annealing comprises: heating the as-fabricated organic light emitting device up to the annealing temperature at a heating rate; and
    cooling the as-fabricated organic light emitting device from the annealing temperature to a lower temperature at a cooling rate,
    wherein the heating rate and the cooling rate are each from about 0.5° C./min to about 20° C./min.

11. The method of claim 10, wherein the heating rate and the cooling rate are each from about 1° C./min to about 5° C./min.

12. A method of treating organic light emitting devices, comprising:
    placing a first as-fabricated organic light emitting device in an annealing chamber;
    placing a second as-fabricated organic light emitting device in an annealing chamber;
    wherein the first and second as-fabricated organic light emitting devices each comprise:
    an anode;
    a cathode; and
    a light emission region that comprises an organic light emitting material disposed between the anode and the cathode; and
    annealing the first and second as-fabricated organic light emitting devices at an annealing temperature from about 50° C. and below 100° C. and for an annealing period effective to (i) decrease the operating voltage of each of the first and second as-fabricated organic light emitting devices, and (ii) increase an energy conversion efficiency of each of the first and second as-fabricated organic light emitting devices;
    wherein the annealed first and second as-fabricated organic light emitting devices have respective energy conversion efficiencies that differ by less than about 15%;
    wherein the annealing temperature is below a glass transition temperature of a material of the organic light emitting device.

13. The method of claim 12, wherein the first and second as-fabricated organic light emitting devices are annealed together in a same annealing chamber.

14. The method of claim 12, wherein the first and second as-fabricated organic light emitting devices are annealed separately in one of a same annealing chamber and a different annealing chamber.

15. The method of claim 12, wherein the annealing temperature is below a melting temperature of a material having a lowest melting temperature of the entire organic light emitting device.

16. The method of claim 12, wherein the annealing temperature is below a glass transition temperature of a material having a lowest glass transition temperature of the entire organic light emitting device.

17. The method of claim 12, wherein the annealing period is from about 0.1 hrs. to about 100 hrs.

18. The method of claim 12, wherein the annealing comprises:
    heating the first and the second as-fabricated organic light emitting devices to the annealing temperature at a heating rate; and
    cooling the first and the second as-fabricated organic light emitting devices from the annealing temperature to a lower temperature at a cooling rate;
    wherein the heating rate and the cooling rate are each from about 0.5° C./min to about 20° C./min.

19. The method of claim 18, wherein the heating rate and the cooling rate are each from about 1° C./min to about 5° C./min.

* * * * *